(12) United States Patent
Cheng et al.

(10) Patent No.: US 8,485,698 B2
(45) Date of Patent: Jul. 16, 2013

(54) HEAT PIPE, HEAT DISSIPATING MODULE AND ILLUMINATION DEVICE

(75) Inventors: Chia-Chun Cheng, New Taipei (TW);
Lei-Lei Liu, New Taipei (TW)

(73) Assignee: Cooler Master Co., Ltd., Zhonghe Dist., New Taipei (TW)

( * ) Notice: Subject to any disclaimer, the term of this patent is extended or adjusted under 35 U.S.C. 154(b) by 77 days.

(21) Appl. No.: 13/281,430

(22) Filed: Oct. 26, 2011

(65) Prior Publication Data

US 2013/0107547 A1    May 2, 2013

(51) Int. Cl.
*F21V 29/00* (2006.01)
*F21V 29/02* (2006.01)
*F28D 15/02* (2006.01)

(52) U.S. Cl.
USPC ........... 362/373; 362/294; 362/235; 361/700; 165/80.3; 165/104.33

(58) Field of Classification Search
USPC ........ 362/294, 373, 547, 218; 165/80.1–80.3, 165/104.33; 361/700
See application file for complete search history.

(56) References Cited

U.S. PATENT DOCUMENTS

| | | | |
|---|---|---|---|
| 6,938,681 B2 * | 9/2005 | Chen et al. | 165/104.33 |
| 7,188,663 B2 | 3/2007 | Lin | |
| 7,296,617 B2 | 11/2007 | Lee | |
| 7,331,379 B2 | 2/2008 | Chen | |
| 2007/0000646 A1 * | 1/2007 | Chen et al. | 165/104.33 |
| 2009/0242176 A1 * | 10/2009 | Liu et al. | 165/104.33 |
| 2009/0316400 A1 * | 12/2009 | Kuo et al. | 362/235 |

FOREIGN PATENT DOCUMENTS

TW    I312400    7/2009

* cited by examiner

*Primary Examiner* — Mariceli Santiago
(74) *Attorney, Agent, or Firm* — Winston Hsu; Scott Margo

(57) ABSTRACT

A heat dissipating module includes a first heat conducting plate, a second heat conducting plate and at least one heat pipe. The second heat conducting plate is disposed opposite to the first heat conducting plate. Each of the at least one heat pipe includes a first fixing portion, a first curved portion, a second fixing portion, a second curved portion and a connecting portion. The first fixing portion is positioned on the first heat conducting plate and the second fixing portion is positioned on the second heat conducting plate. The first curved portion is curved and extended from the first fixing portion. The second curved portion is curved and extended from the second fixing portion. The connecting portion is connected between the first curved portion and the second curved portion. At least parts of the first curved portion and at least parts of the second curved portion are not coplanar.

17 Claims, 11 Drawing Sheets

HEAT PIPE, HEAT DISSIPATING MODULE AND ILLUMINATION DEVICE

BACKGROUND OF THE INVENTION

1. Field of the Invention

The invention relates to a heat pipe, a heat dissipating module and an illumination device and, more particularly, to a heat pipe capable of converting pressure into torsion, wherein the heat pipe can be applied to a heat dissipating module and an illumination device.

2. Description of the Prior Art

Heat dissipating module is a significant component for electronic products. When an electronic product is operating, the current in circuit will generate unnecessary heat due to impedance. If the heat is accumulated in the electronic components of the electronic product without dissipating immediately, the electronic components may get damage due to the accumulated heat. Therefore, the performance of heat dissipating module is a significant issue for the electronic product.

In general, most of the heat dissipating modules are equipped with heat pipes for conducting heat from electronic components to a heat sink and then the heat is dissipated out of the electronic product by the heat sink. The prior arts related to the heat pipe can be referred to Taiwan patent No. 1312400, U.S. Pat. No. 7,188,663, U.S. Pat. No. 7,296,617 and U.S. Pat. No. 7,331,379, etc. So far most of the heat pipes are formed by bending process and each portion of the heat pipe is coplanar. When the conventional heat pipe is forced by a pressure, a fixing end of the heat pipe will deflect downwardly so that stress concentration may be formed at bending point. Once the heat pipe is forced by the pressure for a long time or the pressure is too large, the wall of the heat pipe may collapse or even fracture.

SUMMARY OF THE INVENTION

The invention provides a heat pipe capable of converting pressure into torsion so as to solve the aforesaid problems. Especially, the heat pipe can be applied to a heat dissipating module and an illumination device.

At least parts of a first curved portion and at least parts of a second curved portion of the heat pipe are not coplanar, such that the first curved portion and the second curved portion can convert pressure into torsion so as to disperse the pressure on the heat pipe uniformly when the pressure is acted on a first fixing portion or a second fixing portion of the heat pipe. Accordingly, once the heat pipe of the invention is forced by the pressure, there is no stress concentration formed at the first curved portion and the second curved portion so as to prevent the wall of the heat pipe from collapsing or even fracturing. Furthermore, according to the aforesaid structure design, the heat pipe of the invention can further absorb assembly tolerance, absorb vibration during transportation, and provide deformation space for thermal expansion and contraction.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
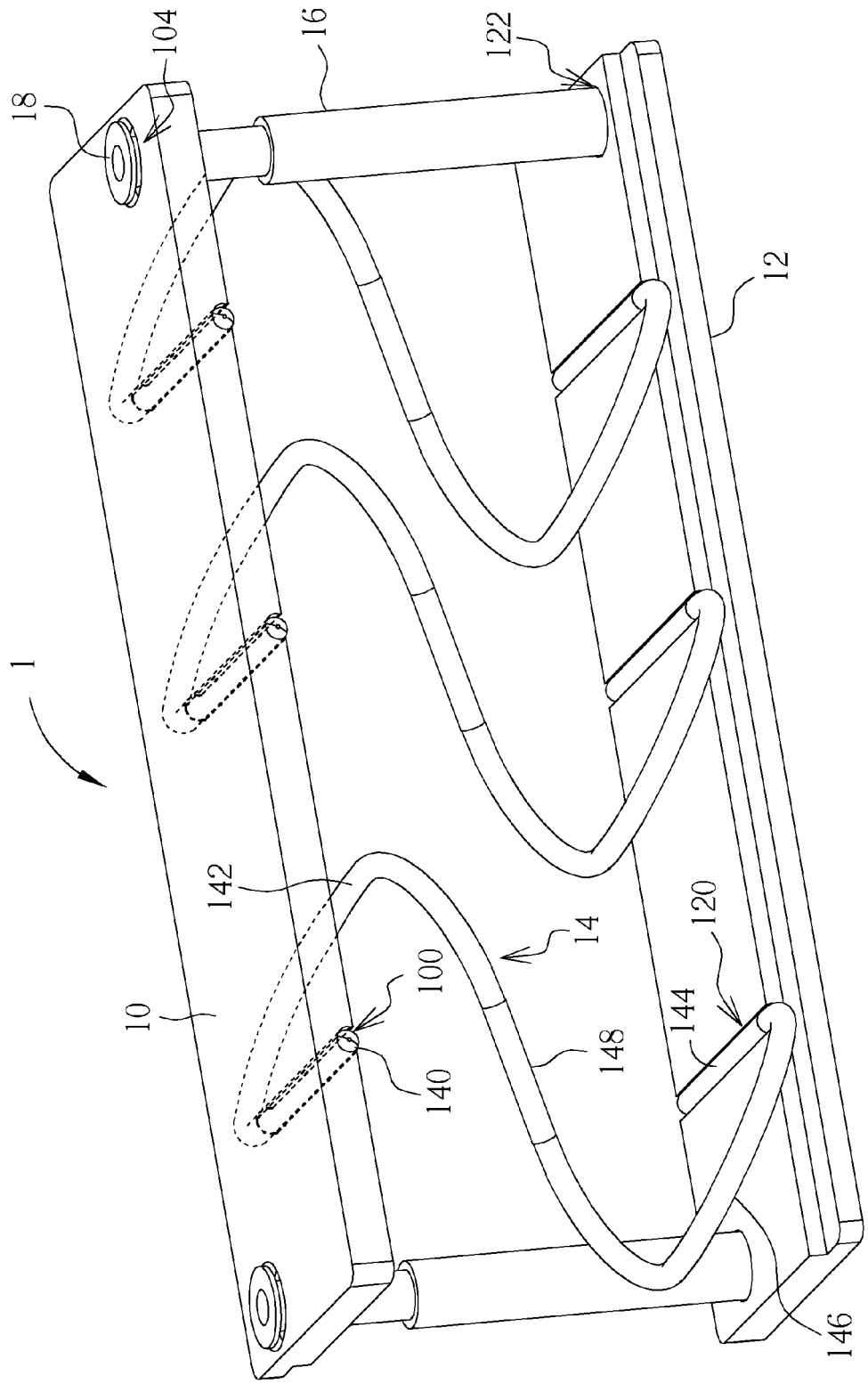
FIG. 1 is a perspective view illustrating a heat dissipating module according to a first embodiment of the invention.
Figure 2:
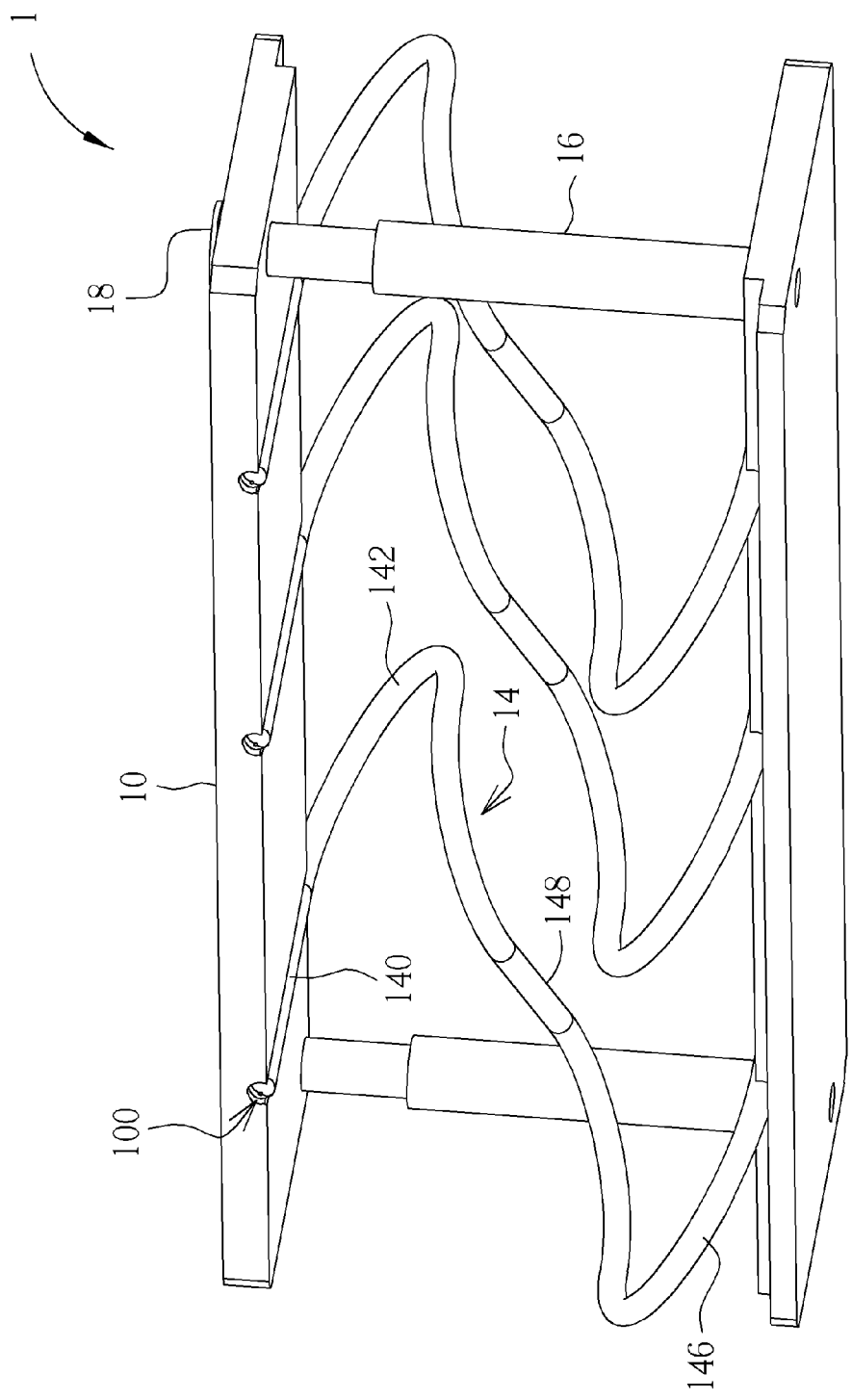
FIG. 2 is a perspective view illustrating the heat dissipating module shown in FIG. 1 from another view angle.
Figure 3:
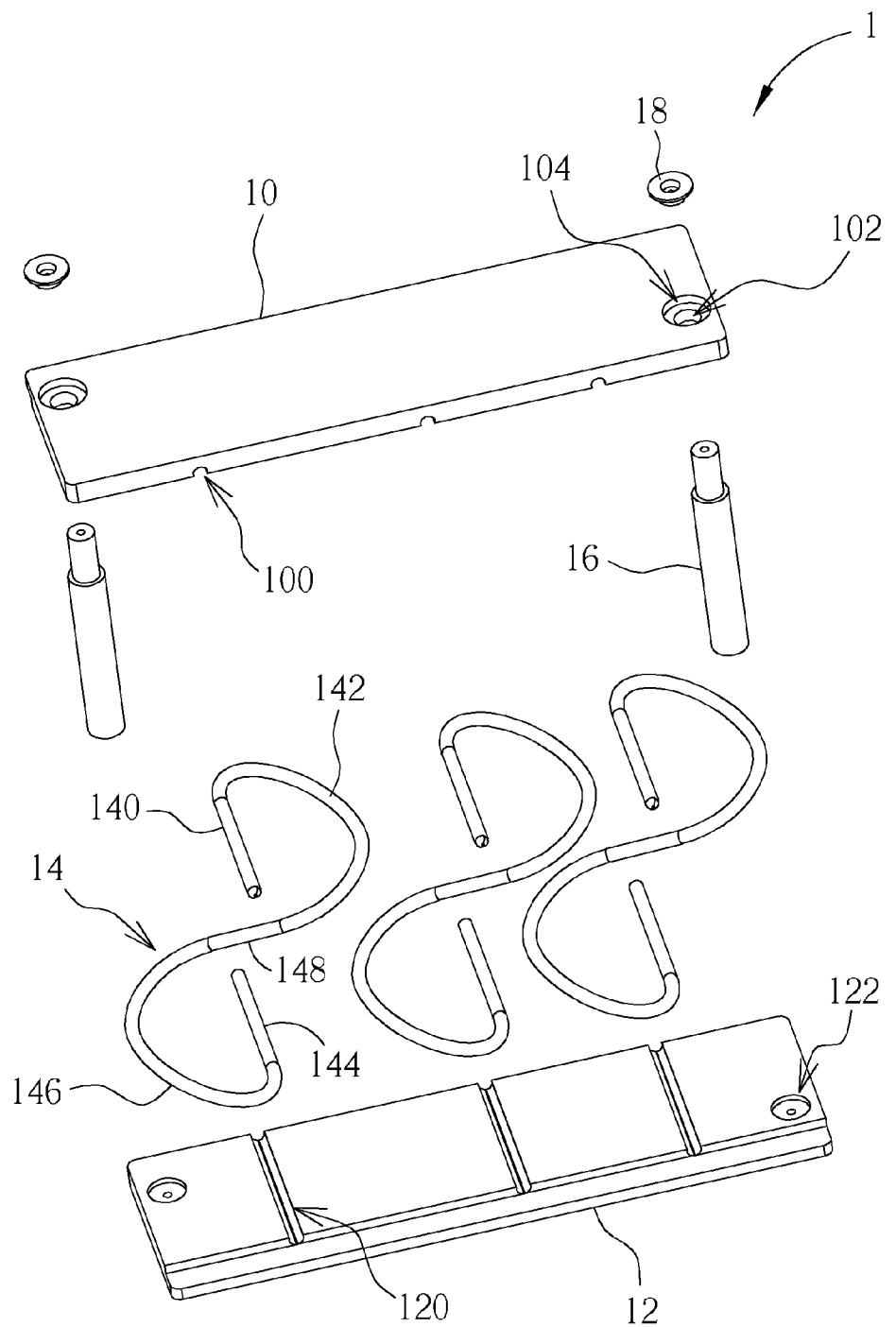
FIG. 3 is an exploded view illustrating the heat dissipating module shown in FIG. 1.
Figure 4:
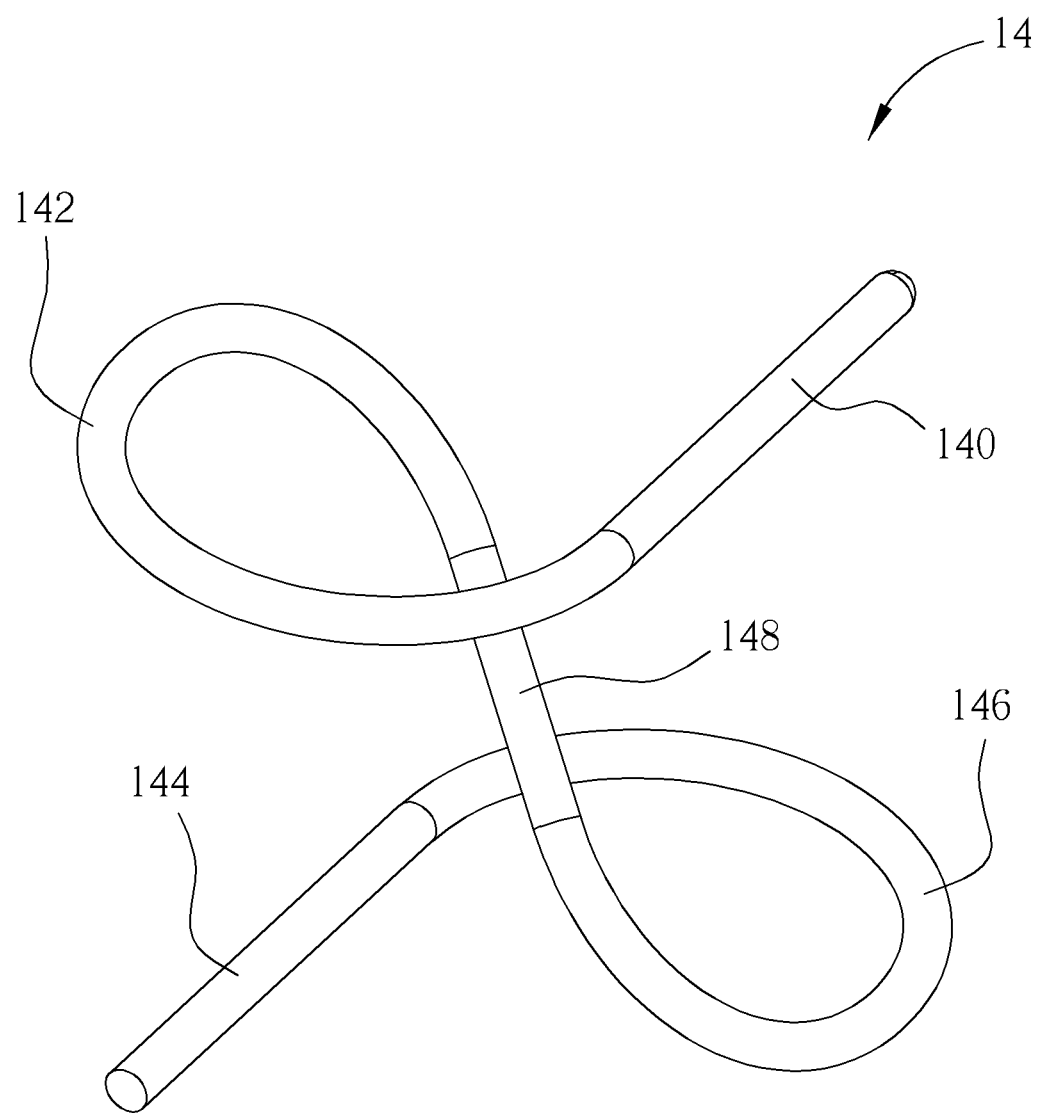
FIG. 4 is a perspective view illustrating one heat pipe shown in FIG. 3 from another view angle.
Figure 5:
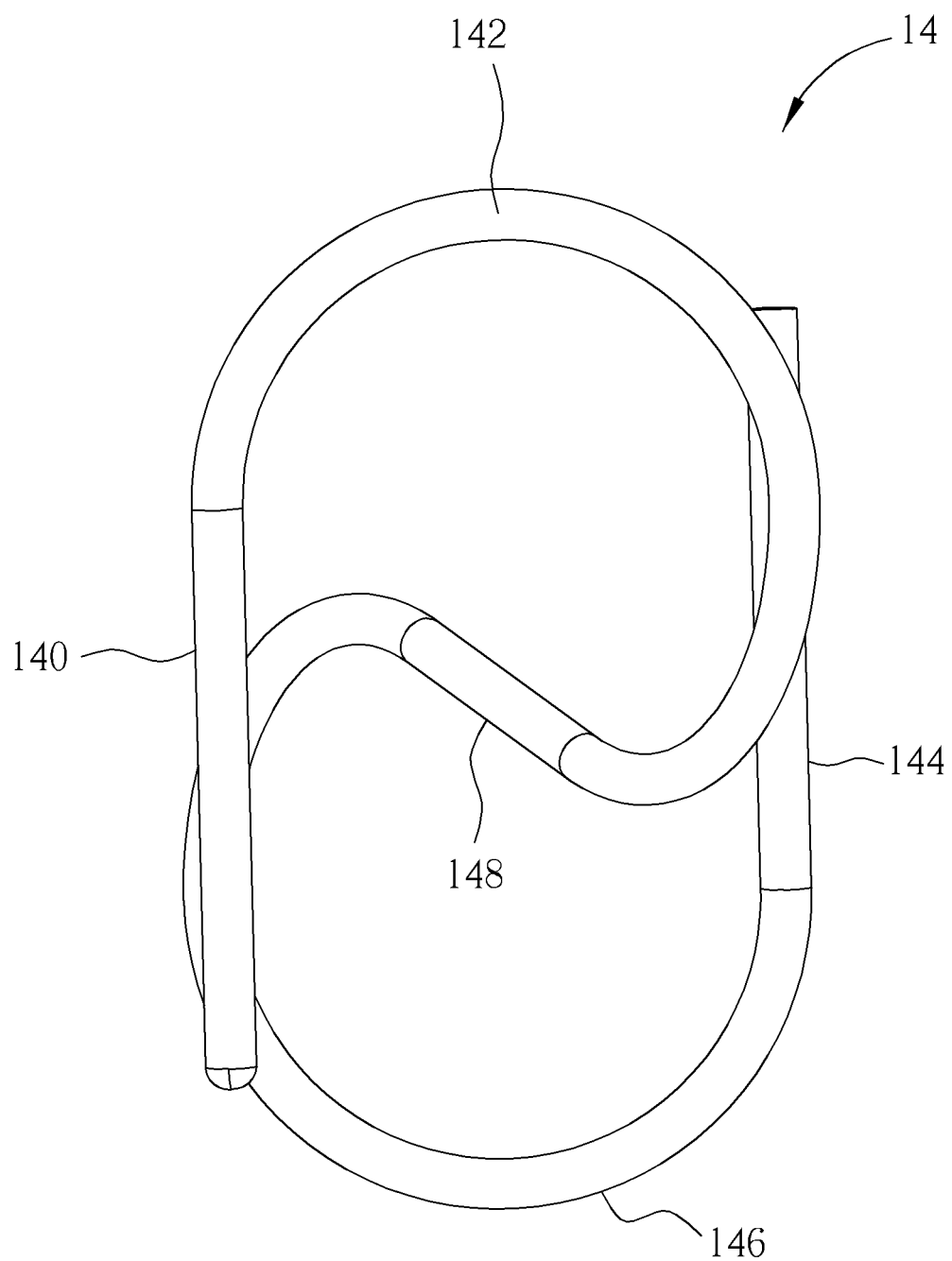
FIG. 5 is a top view illustrating one heat pipe shown in FIG. 3.

Referring to FIGS. 1 to 5, FIG. 1 is a perspective view illustrating a heat dissipating module 1 according to a first embodiment of the invention, FIG. 2 is a perspective view illustrating the heat dissipating module 1 shown in FIG. 1 from another view angle, FIG. 3 is an exploded view illustrating the heat dissipating module 1 shown in FIG. 1, FIG. 4 is a perspective view illustrating one heat pipe 14 shown in FIG. 3 from another view angle, and FIG. 5 is a top view illustrating one heat pipe 14 shown in FIG. 3. As shown in FIGS. 1 to 5, the heat dissipating module 1 comprises a first heat conducting plate 10, a second heat conducting plate 12, three heat pipes 14, two support members 16 and two covers 18. It should be noted that the number of the heat pipes 14, the support members 16 and the covers 18 can be determined according to practical applications and is not the limitation of the embodiment shown in FIGS. 1 to 3.

The second heat conducting plate 12 is disposed opposite to the first heat conducting plate 10 and the support members 16 are disposed between the first heat conducting plate 10 and the second heat conducting plate 12. Each of the heat pipes 14 comprises a first fixing portion 140, a first curved portion 142, a second fixing portion 144, a second curved portion 146 and a connecting portion 148. The first fixing portion 140 is positioned on the first heat conducting plate 10 and the second fixing portion 144 is positioned on the second heat conducting plate 12. The first curved portion 142 is curved and extended from the first fixing portion 140. The second curved portion 146 is curved and extended from the second fixing portion 144. The connecting portion 148 is connected between the first curved portion 142 and the second curved portion 146. In this embodiment, the connecting portion 148 is arc-shaped. However, in another embodiment, the connecting portion 148 may be straight-shaped. That is to say, the shape of the connecting portion 148 can be determined according to practical applications. Furthermore, in this embodiment, the first curved portion 142 and the second curved portion 146 are spiral-shaped.

Moreover, the first heat conducting plate 10 has three first grooves 100, and the second heat conducting plate 12 has three second grooves 120. The first fixing portion 140 is positioned in the first groove 100 correspondingly, and the second fixing portion 144 is positioned in the second groove 120 correspondingly. It should be noted that the number of the first grooves 100 and the second grooves 120 are determined according to the number of the heat pipes 14 and is not the limitation of the embodiment shown in FIGS. 1 to 3.

During assembling the heat dissipating module 1, the first, one end of the support member 16 has to be disposed in the recess 122 of the second heat conducting plate 12, and the second fixing portion 144 of the heat pipe 14 has to be positioned in the second groove 120. Afterward, the first heat conducting plate 10 has to be disposed on the support member 16 and the heat pipe 14 so as to insert the other end of the support member 16 through the hole 102 of the first heat conducting plate 10 and position the fixing portion 140 of the heat pipe 14 in the first groove 100. Finally, the cover 18 is fastened on the recess 104 of the first heat conducting plate 10. Accordingly, the heat dissipating module 1 is assembled completely.

It should be noted that the aforesaid support members 16 and covers 18 may be removed from the heat dissipating module 1 of the invention. If the heat dissipating module 1 does not comprise the aforesaid support members 16 and covers 18, an operator only has to position the first fixing portion 140 in the first groove 100 and position the second fixing portion 144 in the second groove 120, so as to finish assembling the heat dissipating module 1.

As shown in FIGS. 3 and 4, at least parts of the first curved portion 142 and at least parts of the second curved portion 146 are not coplanar. It should be noted that the first curved portion 142 and the second curved portion 146 may be not coplanar absolutely and that depends on practical applications. As shown in FIG. 5, a projection of the first curved portion 142 and a projection of the second curved portion 146 are staggered along a direction from the first fixing portion 140 toward the second fixing portion 144. According to the aforesaid structure design, the first curved portion 142 and the second curved portion 146 can convert pressure into torsion so as to disperse the pressure on the heat pipe 14 uniformly when the pressure is acted on the first fixing portion 140 or the second fixing portion 144 of the heat pipe 14. Accordingly, once the heat pipe 14 of the invention is forced by the pressure, there is no stress concentration formed at the first curved portion 142 and the second curved portion 146 so as to prevent the wall of the heat pipe from collapsing or even fracturing. Furthermore, according to the aforesaid structure design, the heat pipe 14 of the invention can absorb assembly tolerance, absorb vibration during transportation, and provide deformation space for thermal expansion and contraction.

Figure 6:
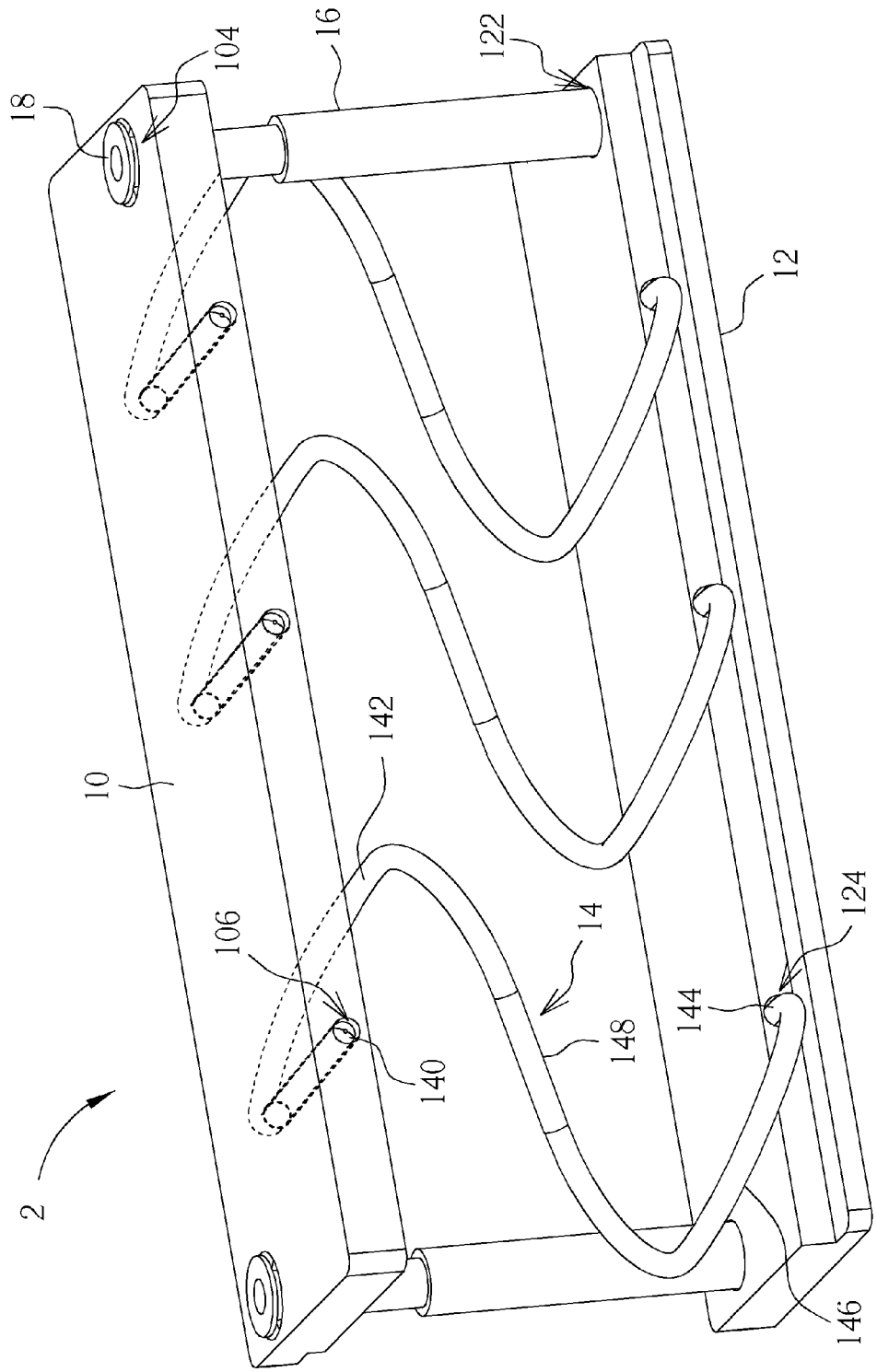
FIG. 6 is a perspective view illustrating a heat dissipating module according to a second embodiment of the invention.

Referring to FIG. 6 along with FIG. 1, FIG. 6 is a perspective view illustrating a heat dissipating module 2 according to a second embodiment of the invention. The difference between the heat dissipating module 2 and the aforesaid heat dissipating module 1 is that the first heat conducting plate 10 of the heat dissipating module 2 has three first holes 106, and the second heat conducting plate 12 of the heat dissipating module 2 has three second holes 124. As shown in FIG. 6, the first fixing portion 140 of the heat pipe 14 is positioned in the first hole 106 correspondingly, and the second fixing portion 144 of the heat pipe 14 is positioned in the second hole 124 correspondingly. It should be noted that the same elements in FIG. 6 and FIG. 1 are represented by the same numerals, so the repeated explanation will not be depicted herein again.

Figure 7:
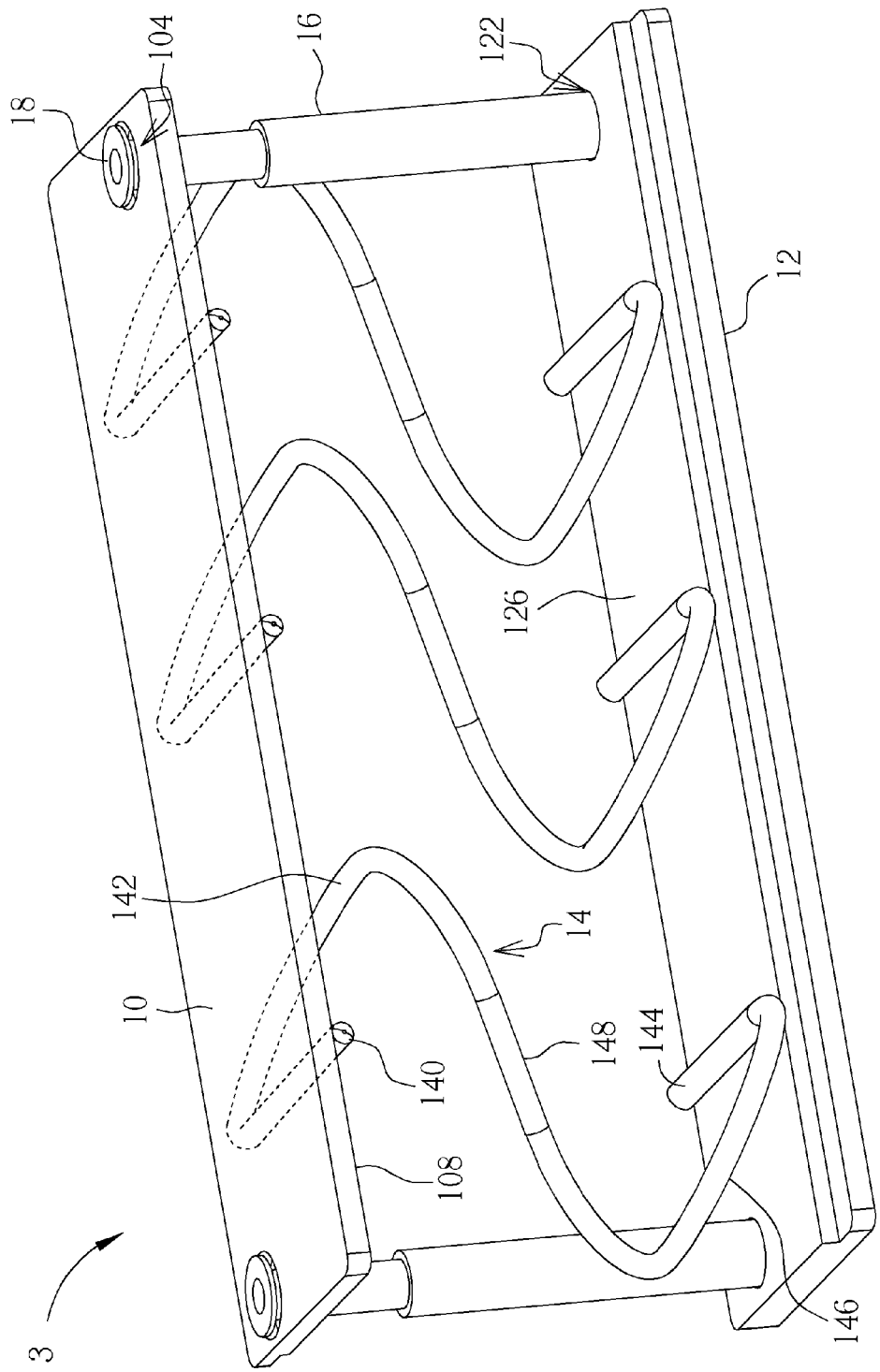
FIG. 7 is a perspective view illustrating a heat dissipating module according to a third embodiment of the invention.

Referring to FIG. 7 along with FIG. 1, FIG. 7 is a perspective view illustrating a heat dissipating module 3 according to a third embodiment of the invention. The difference between the heat dissipating module 3 and the aforesaid heat dissipating module 1 is that the first fixing portion 140 and the second fixing portion 144 of the heat pipe 14 of the heat dissipating module 3 are positioned on a surface 108 of the first heat conducting plate 10 and a surface 126 of the second heat conducting plate 12 respectively. In this embodiment, the first fixing portion 140 and the second fixing portion 144 of the heat pipe 14 may be positioned on the surface 108 and the surface 126 respectively by soldering process. It should be noted that the same elements in FIG. 7 and FIG. 1 are represented by the same numerals, so the repeated explanation will not be depicted herein again.

Figure 8:
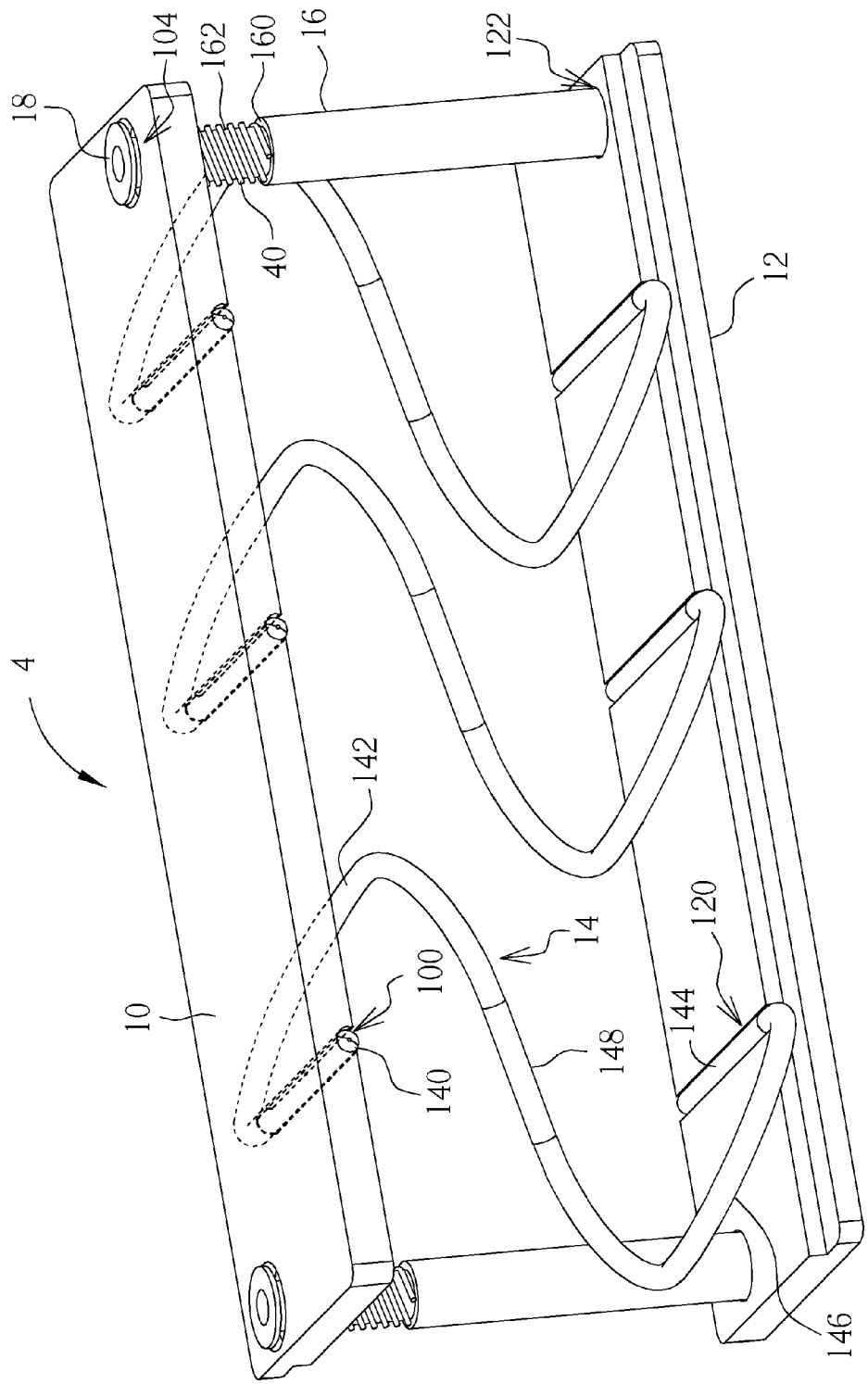
FIG. 8 is a perspective view illustrating a heat dissipating module according to a fourth embodiment of the invention.

Referring to FIG. 8 along with FIG. 1, FIG. 8 is a perspective view illustrating a heat dissipating module 4 according to a fourth embodiment of the invention. The difference between the heat dissipating module 4 and the aforesaid heat dissipating module 1 is that the heat dissipating module 4 further comprises two first resilient members 40 disposed on the two support members 16 respectively. As shown in FIG. 8, the support member 16 has a first stop portion 160. After assembling the heat dissipating module 4, one end 162 of the support member 16 can move with respect to the first heat conducting plate 10, one end of the first resilient member 40 abuts against the first stop portion 160 and another end of the first resilient member 40 abuts against the first heat conducting plate 10. Accordingly, when a pressure is acted on the first heat conducting plate 10 or the second heat conducting plate 12, the first resilient member 40 can function as a cushion. It should be noted that the same elements in FIG. 8 and FIG. 1 are represented by the same numerals, so the repeated explanation will not be depicted herein again.

Figure 9:
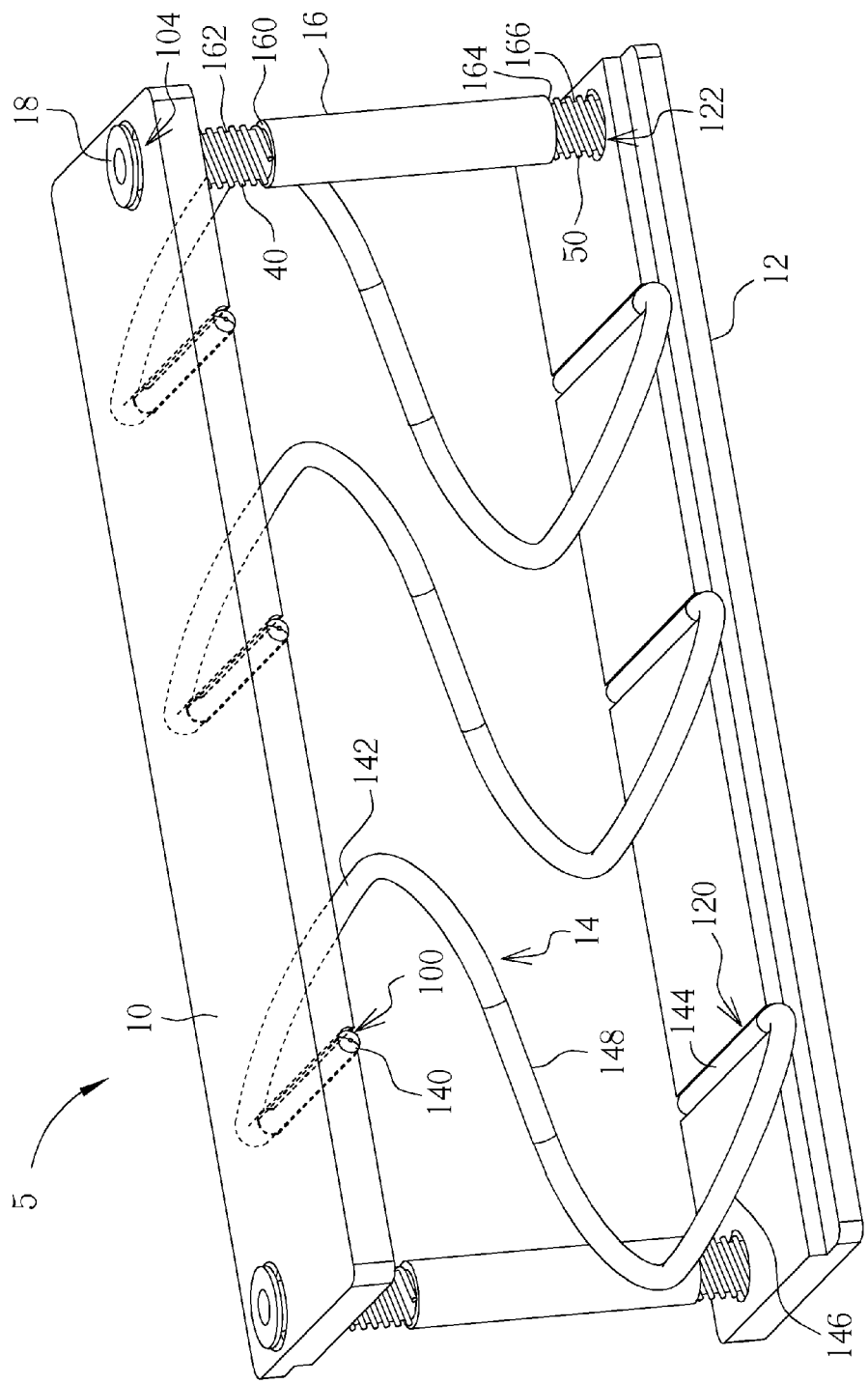
FIG. 9 is a perspective view illustrating a heat dissipating module according to a fifth embodiment of the invention.

Referring to FIG. 9 along with FIG. 8, FIG. 9 is a perspective view illustrating a heat dissipating module 5 according to a fifth embodiment of the invention. The difference between the heat dissipating module 5 and the aforesaid heat dissipating module 4 is that the heat dissipating module 5 further comprises two second resilient members 50 disposed on the two support members 16 respectively. As shown in FIG. 9, the support member 16 further has a second stop portion 164 opposite to the first stop portion 160. After assembling the heat dissipating module 5, one end 166 of the support member 16 can move with respect to the second heat conducting plate 12, one end of the second resilient member 50 abuts against the second stop portion 164 and another end of the second resilient member 50 abuts against the second heat conducting plate 12. Accordingly, when a pressure is acted on the first heat conducting plate 10 or the second heat conducting plate 12, the first resilient member 40 and the second resilient member 50 can function as cushions. It should be noted that the same elements in FIG. 9 and FIG. 8 are represented by the same numerals, so the repeated explanation will not be depicted herein again.

Figure 10:
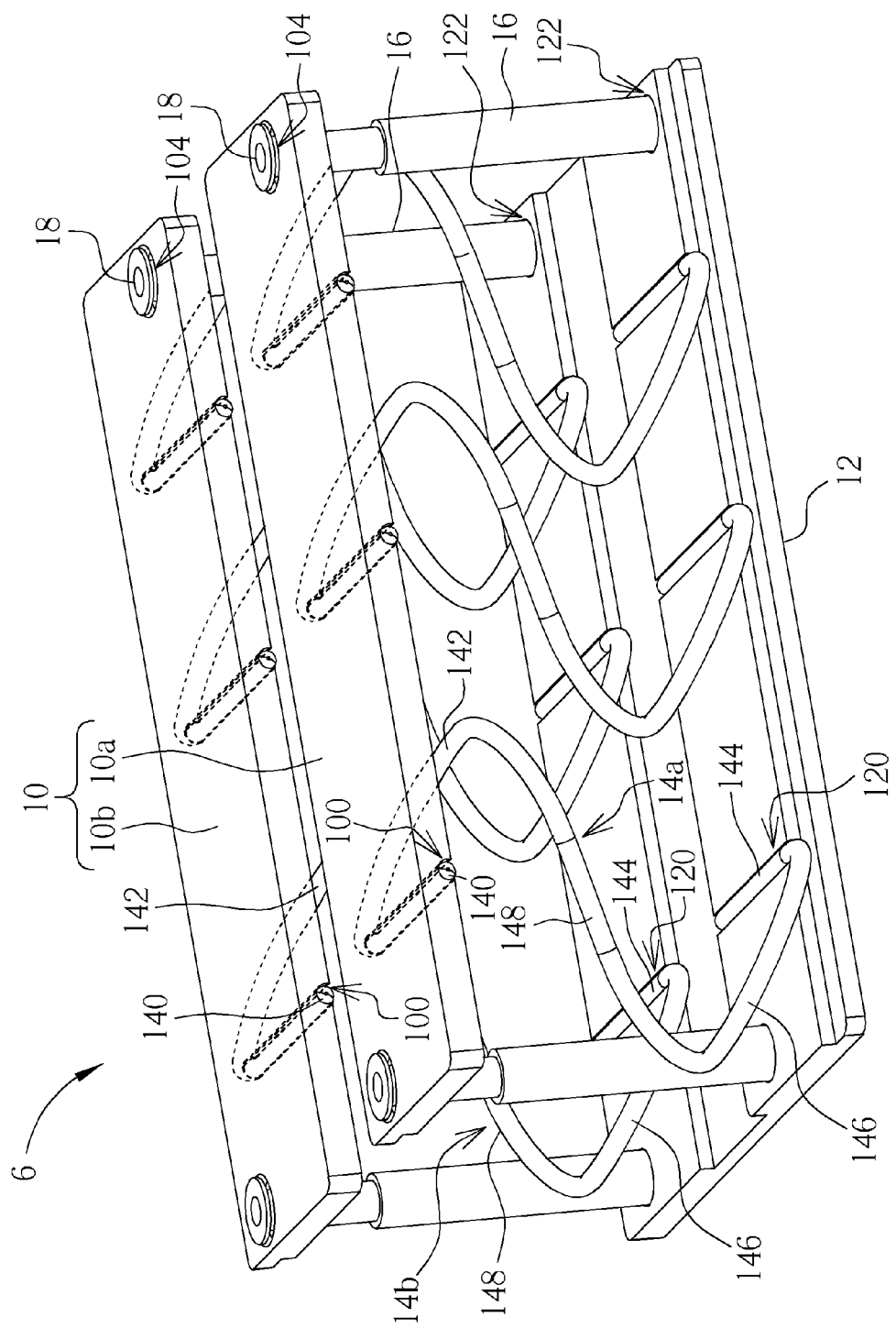
FIG. 10 is a perspective view illustrating a heat dissipating module according to a sixth embodiment of the invention.

Referring to FIG. 10 along with FIG. 1, FIG. 10 is a perspective view illustrating a heat dissipating module 6 according to a sixth embodiment of the invention. The difference between the heat dissipating module 6 and the aforesaid heat dissipating module 1 is that the first heat conducting plate 10 comprises a first sub-heat conducting plate 10a and a second sub-heat conducting plate 10b, and the heat dissipating module 6 comprises six heat pipes 14a, 14b. As shown in FIG. 10, three heat pipes 14a are positioned between the first sub-heat conducting plate 10a and the second heat conducting plate 12, and three heat pipes 14b are positioned between the second sub-heat conducting plate 10b and the second heat conducting plate 12. The first fixing portion 140 and the second fixing portion 144 of the heat pipe 14a are positioned on the first sub-heat conducting plate 10a and the second heat conducting plate 12 respectively, and the first fixing portion 140 and the second fixing portion 144 of the heat pipe 14b are positioned on the second sub-heat conducting plate 10b and the second heat conducting plate 12 respectively. When the shape of an electronic product, which is equipped with the heat dissipating module 6 of the invention, is curved or irregular, the first heat conducting plate 10 may be divided into a plurality of sub-heat conducting plates so as to increase flexibility of the shape of the electronic product. It should be noted that the same elements in FIG. 10 and FIG. 1 are represented by the same numerals, so the repeated explanation will not be depicted herein again.

Figure 11:
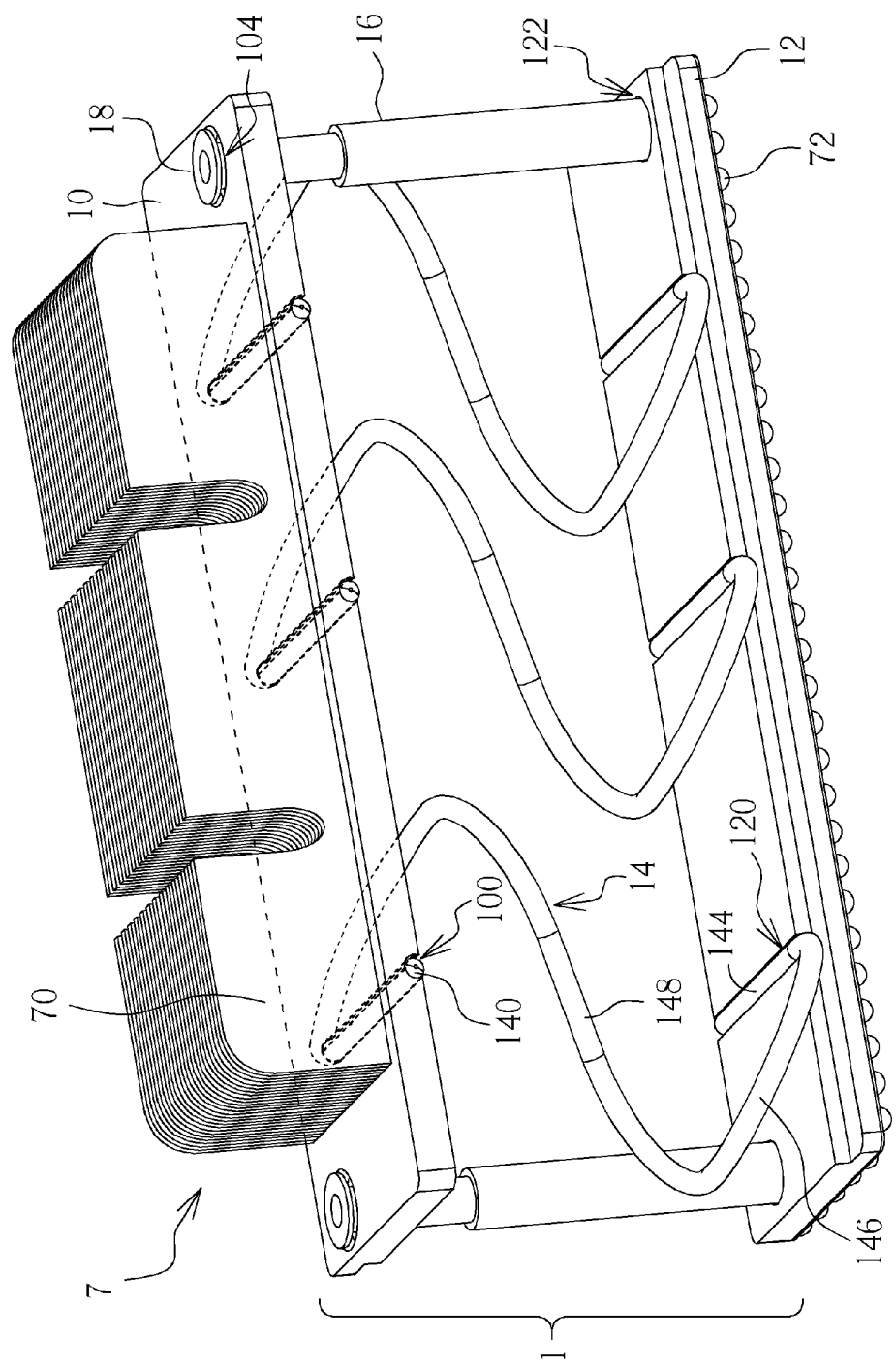
FIG. 11 is a perspective view illustrating an illumination device according to a seventh embodiment of the invention.

Referring to FIG. 11 along with FIG. 1, FIG. 11 is a perspective view illustrating an illumination device 7 according to a seventh embodiment of the invention. The illumination device 7 comprises the heat dissipating module 1 shown in FIG. 1, a heat dissipating member 70 and a light emitting module 72. The heat dissipating member 70 is disposed on the first heat conducting plate 10 and the light emitting module 72 is disposed on the second heat conducting plate 12. In this embodiment, the heat dissipating member 70 may be, but not limited to, a heat sink with heat dissipating fins, and the light emitting module 72 may be, but not limited to, a light emitting diode module. Furthermore, the number of light emitting diodes disposed on the light emitting module 72 can be determined according to practical applications. When the illumination device is operating, the heat generated by the light emitting module 72 can be conducted to the heat dissipating member 70 through the second heat conducting plate 12, the heat pipes 14 and the first heat conducting plate 10 and then can be dissipated by the heat dissipating member 70. It should be noted that the same elements in FIG. 11 and FIG. 1 are represented by the same numerals, so the repeated explanation will not be depicted herein again. Moreover, the heat dissipating module 1 of the illumination device 7 may be replaced by the heat dissipating modules 2 to 6 shown in FIGS. 6 to 10.

Since at least parts of the first curved portion and at least parts of the second curved portion are not coplanar, the first curved portion and the second curved portion can convert pressure into torsion so as to disperse the pressure on the heat pipe uniformly when the pressure is acted on the first fixing portion or the second fixing portion of the heat pipe. Accordingly, once the heat pipe of the invention is forced by the pressure, there is no stress concentration formed at the first curved portion and the second curved portion so as to prevent the wall of the heat pipe from collapsing or even fracturing. Furthermore, according to the aforesaid structure design, the heat pipe of the invention can further absorb assembly tolerance, absorb vibration during transportation, and provide deformation space for thermal expansion and contraction.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A heat dissipating module comprising:
    a first heat conducting plate;
    a second heat conducting plate disposed opposite to the first heat conducting plate;
    at least one heat pipe, each of the at least one heat pipe comprising:
        a first fixing portion positioned on the first heat conducting plate;
        a first curved portion curved and extended from the first fixing portion;
        a second fixing portion positioned on the second heat conducting plate;
        a second curved portion curved and extended from the second fixing portion, at least parts of the first curved portion and at least parts of the second curved portion being not coplanar; and
        a connecting portion connected between the first curved portion and the second curved portion;
    a support member disposed between the first heat conducting plate and the second heat conducting plate; and
    a first resilient member disposed on the support member, wherein the support member has a first stop portion, one end of the first resilient member abuts against the first stop portion and another end of the first resilient member abuts against the first heat conducting plate.

2. The heat dissipating module of claim 1, wherein a projection of the first curved portion and a projection of the second curved portion are staggered along a direction from the first fixing portion toward the second fixing portion.

3. The heat dissipating module of claim 1, wherein the connecting portion is straight-shaped or arc-shaped.

4. The heat dissipating module of claim 1, wherein the first curved portion and the second curved portion are spiral-shaped.

5. The heat dissipating module of claim 1, further comprising a second resilient member disposed on the support member, wherein the support member has a second stop portion opposite to the first stop portion, one end of the second resilient member abuts against the second stop portion and another end of the second resilient member abuts against the second heat conducting plate.

6. The heat dissipating module of claim 1, wherein the first heat conducting plate has at least one first groove, the second heat conducting plate has at least one second groove, the first fixing portion is positioned in the first groove correspondingly, and the second fixing portion is positioned in the second groove correspondingly.

7. The heat dissipating module of claim 1, wherein the first heat conducting plate has at least one first hole, the second heat conducting plate has at least one second hole, the first fixing portion is positioned in the first hole correspondingly, and the second fixing portion is positioned in the second hole correspondingly.

8. The heat dissipating module of claim 1, wherein the first fixing portion and the second fixing portion are positioned on a surface of the first heat conducting plate and a surface of the second heat conducting plate respectively.

9. The heat dissipating module of claim 1, wherein the first heat conducting plate comprises a first sub-heat conducting plate and a second sub-heat conducting plate, at least one heat pipe is positioned between the first sub-heat conducting plate and the second heat conducting plate, and at least one heat pipe is positioned between the second sub-heat conducting plate and the second heat conducting plate.

10. An illumination device comprising:
    a heat dissipating module comprising:
        a first heat conducting plate;
        a second heat conducting plate disposed opposite to the first heat conducting plate;
        at least one heat pipe, each of the at least one heat pipe comprising:
            a first fixing portion positioned on the first heat conducting plate;
            a first curved portion curved and extended from the first fixing portion;
            a second fixing portion positioned on the second heat conducting plate;
            a second curved portion curved and extended from the second fixing portion, at least parts of the first curved portion and at least parts of the second curved portion being not coplanar; and a connecting portion connected between the first curved portion and the second curved portion;

a support member disposed between the first heat conducting plate and the second heat conducting plate; and a first resilient member disposed on the support member, wherein the support member has a first stop portion, one end of the first resilient member abuts against the first stop portion and another end of the first resilient member abuts against the first heat conducting plate;

a heat dissipating member disposed on the first heat conducting plate; and a light emitting module disposed on the second heat conducting plate.

11. The illumination device of claim 10, wherein the connecting portion is straight-shaped or arc-shaped.

12. The illumination device of claim 10, wherein the first curved portion and the second curved portion are spiral-shaped.

13. The illumination device of claim 10, wherein the heat dissipating module further comprises a second resilient member disposed on the support member, the support member has a second stop portion opposite to the first stop portion, one end of the second resilient member abuts against the second stop portion and another end of the second resilient member abuts against the second heat conducting plate.

14. The illumination device of claim 10, wherein the first heat conducting plate has at least one first groove, the second heat conducting plate has at least one second groove, the first fixing portion is positioned in the first groove correspondingly, and the second fixing portion is positioned in the second groove correspondingly.

15. The illumination device of claim 10, wherein the first heat conducting plate has at least one first hole, the second heat conducting plate has at least one second hole, the first fixing portion is positioned in the first hole correspondingly, and the second fixing portion is positioned in the second hole correspondingly.

16. The illumination device of claim 10, wherein the first fixing portion and the second fixing portion are positioned on a surface of the first heat conducting plate and a surface of the second heat conducting plate respectively.

17. The illumination device of claim 10, wherein the first heat conducting plate comprises a first sub-heat conducting plate and a second sub-heat conducting plate, at least one heat pipe is positioned between the first sub-heat conducting plate and the second heat conducting plate, and at least one heat pipe is positioned between the second sub-heat conducting plate and the second heat conducting plate.

* * * * *